(12) United States Patent  
Lu

(10) Patent No.: US 10,217,712 B2  
(45) Date of Patent: Feb. 26, 2019

(54) SEMICONDUCTOR PACKAGE AND SEMICONDUCTOR PROCESS FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/382,594

(22) Filed: Dec. 16, 2016

(65) Prior Publication Data

US 2018/0174981 A1 Jun. 21, 2018

(51) Int. Cl.
| | |
|---|---|
| *H01L 23/00* | (2006.01) |
| *H01L 23/498* | (2006.01) |
| *H01L 23/48* | (2006.01) |
| *H01L 21/48* | (2006.01) |

(52) U.S. Cl.
CPC .......... *H01L 23/562* (2013.01); *H01L 21/486* (2013.01); *H01L 21/4853* (2013.01); *H01L 21/4857* (2013.01); *H01L 23/49822* (2013.01); *H01L 23/49827* (2013.01); *H01L 23/49838* (2013.01); *H01L 24/16* (2013.01); *H01L 2224/16227* (2013.01); *H01L 2924/3511* (2013.01)

(58) Field of Classification Search
CPC . H01L 24/16; H01L 23/562; H01L 23/49822; H01L 23/49827; H01L 23/49838; H01L 21/4853; H01L 21/4857; H01L 21/486
See application file for complete search history.

(56) References Cited

U.S. PATENT DOCUMENTS

| | | | | |
|---|---|---|---|---|
| 5,075,965 | A * | 12/1991 | Carey | B23K 1/0016 228/180.22 |
| 6,330,967 | B1 * | 12/2001 | Milewski | B23K 31/02 228/180.22 |
| 6,492,737 | B1 * | 12/2002 | Imasu | H01L 21/563 257/723 |
| 2003/0019568 | A1 * | 1/2003 | Liu | B32B 7/12 156/245 |
| 2005/0224991 | A1 * | 10/2005 | Yeo | H01L 24/03 257/781 |
| 2007/0080457 | A1 | 4/2007 | Tanida et al. | |

(Continued)

*Primary Examiner* — Christine A Enad
(74) *Attorney, Agent, or Firm* — Foley & Lardner LLP; Cliff Z. Liu

(57) ABSTRACT

A semiconductor package includes a substrate, a dielectric layer, at least one conductive pillar and an electrical device. The dielectric layer is disposed on the substrate and defines at least one through hole corresponding to the respective first pad of the substrate. The conductive pillar is disposed in the respective through hole. The conductive pillar includes a body portion and a cap portion. The body portion is physically connected to the cap portion, and the cap portion is electrically connected to the first pad. A maximum width of the cap portion is greater than a maximum width of the body portion. The electrical device is disposed on the dielectric layer and electrically connected to the body portion of the conductive pillar.

21 Claims, 13 Drawing Sheets

(56) References Cited

U.S. PATENT DOCUMENTS

2013/0277830 A1* 10/2013 Yu .......................... H01L 24/16
  257/737
2015/0340332 A1   11/2015 Rinne et al.
2016/0027764 A1*  1/2016 Kim ....................... H01L 24/97
  257/686

* cited by examiner

SEMICONDUCTOR PACKAGE AND SEMICONDUCTOR PROCESS FOR MANUFACTURING THE SAME

BACKGROUND

1. Field of the Disclosure

The present disclosure relates to a semiconductor package and a process for manufacturing the same, and more particularly to a semiconductor package including at least one conductive pillar with a cap portion, and a process for manufacturing the same.

2. Description of the Related Art

A semiconductor package may include a semiconductor chip and a substrate or other semiconductor device such as an interposer. The substrate may include a redistribution layer (RDL) and bump pads. The semiconductor chip may include pillars bonded to the bump pads in a chip bonding area of the substrate. The bonding between the pillars and the bump pads may suffer from, for example, an incomplete joint connection or bump crack (e.g., experience an intermetallic compound (IMC) crack) due to the joint connection having a low tolerance for lateral stress. In some semiconductor configurations, the quality of the bonding between the pillars and the bump pads of a semiconductor package is dependent on the semiconductor package being able to avoid or minimize warpage of the bonding area or joint during manufacture or use of the semiconductor package. However, some semiconductor packages cannot avoid or minimize warpage of bonding between the pillars and the bump pads because they implement a bonding configuration that does not provide sufficient lateral stress tolerance.

SUMMARY

In an aspect according to some embodiments, a semiconductor package includes a substrate, a dielectric layer, at least one conductive pillar and an electrical device. The substrate includes at least one first pad. The dielectric layer is disposed on the substrate and defines at least one through hole corresponding to the respective first pad. The conductive pillar is disposed in the at least one through hole. The conductive pillar includes a body portion and a cap portion. The body portion is physically connected to the cap portion, and the cap portion is electrically connected to the first pad. A maximum width of the cap portion is greater than a maximum width of the body portion. The electrical device is disposed on the dielectric layer and electrically connected to the body portion of the conductive pillar.

In another aspect according to some embodiments, a semiconductor package includes a substrate, a dielectric layer, at least one conductive pillar and an electrical device. The substrate includes at least one first pad. The dielectric layer is disposed on the substrate and defines at least one through hole which exposes the respective first pad. The conductive pillar is disposed in the at least one through hole. The conductive pillar includes a body portion and a cap portion. The body portion is physically connected to the cap portion, and the cap portion is electrically connected to the first pad. A maximum width of the cap portion is greater than a maximum width of the body portion. The conductive pillar is bent towards a sidewall of the through hole. An electrical device is disposed on the dielectric layer and electrically connected to the body portion of the conductive pillar.

In another aspect according to some embodiments, a semiconductor manufacturing process includes: (a) providing a substrate including at least one first pad; (b) forming a dielectric layer on the substrate; (c) forming at least one through hole in the dielectric layer which exposes the respective first pad; (d) providing an electrical device including at least one conductive pillar, the conductive pillar including a body portion and a cap portion, wherein the body portion is physically connected to the cap portion, and a maximum width of the cap portion is greater than a maximum width of the body portion; and (e) inserting the conductive pillar in the respective through hole, such that the cap portion of the conductive pillar is electrically connected to the first pad.

DETAILED DESCRIPTION

Figure 1:
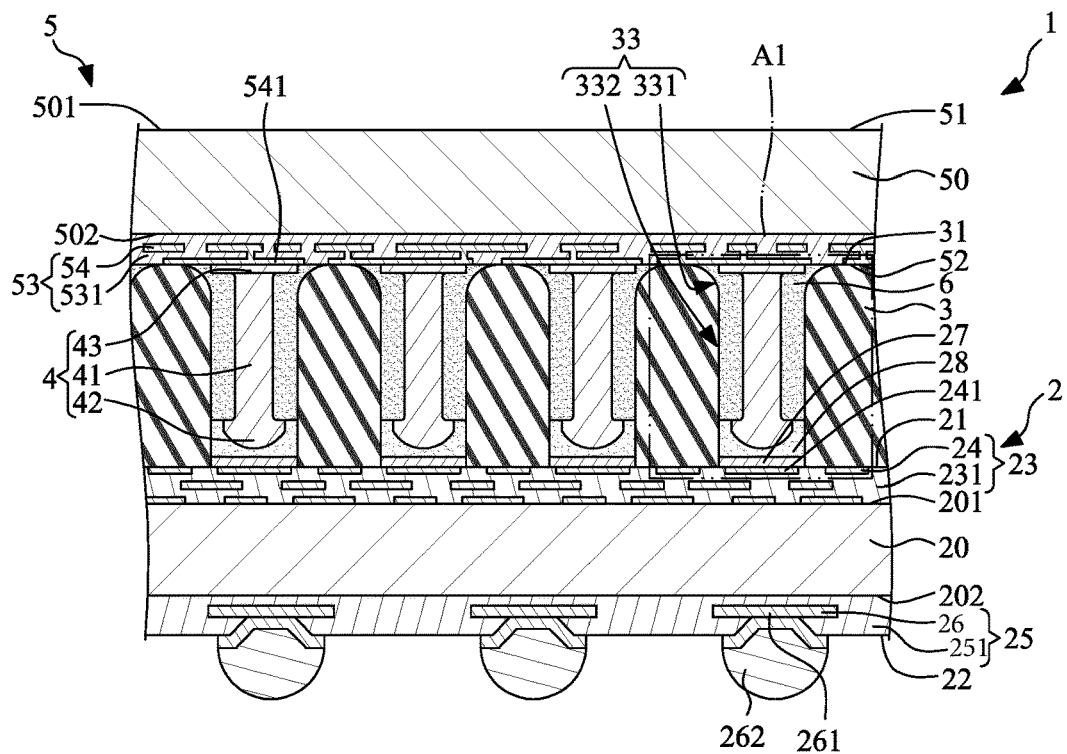
FIG. 1 illustrates an example of a semiconductor package according to some embodiments of the present disclosure.

Some embodiments of the present disclosure provide an improved semiconductor package structure allowing for increased lateral stress tolerance of pillars and bump pads of a semiconductor package.

A semiconductor package may comprise a semiconductor chip and a substrate. Pillars of the semiconductor chip may be bonded to bump pads of the substrate, and each bump pad in the substrate may correspond to a corresponding pillar in the semiconductor chip. To avoid deformations caused by warpage, the bonding between the pillars and the bump pads can tolerate a lateral stress resulting from, for example, thermal stress caused by heating or temperature variations. If the strength of the bonding between the pillars and the bump pads is not sufficient to tolerate the lateral stress caused by heating or temperature variations, the pillars and the bump pads may incur warpage. When warpage occurs, the pillars and/or the bump pads may suffer from deformations. This may lead to incomplete joint connection between the pillars and the bump pads or even bump cracks (e.g., an IMC crack). To address such concerns, the semiconductor package may be designed to have a smaller size so as to reduce the warpage due to the thermal stress. For example, the size of the semiconductor package may be reduced from 10 millimeters (mm)×10 mm to 1 mm×1 mm. However, such design or configuration may significantly reduce the footprint area available for pillars and bump pads. Another solution is to change the materials and/or the structures of the elements of the semiconductor package. However, such design or configuration should take into account coefficient of thermal expansion (CTE) matching between the elements of the semiconductor package, which may significantly increase the manufacturing cost of the semiconductor package. In addition, when the pitch between the pillars is very small, the solder at the tips of two adjacent pillars may form a bridge (e.g., may connect). Further, if the aspect ratio (the ratio of length to width) of the pillar is greater than 10, the pillar may be bent when a compression force is applied, and thus, two adjacent pillars may contact and electrically connect to each other.

To address the above concerns, an improved structure is described herein that provides higher lateral stress tolerance and more compact sizes of pillars and bump pads. The techniques described herein can be beneficial to, for example, yield circuitry with improved performance and to yield a semiconductor package of lower manufacturing cost.

In some embodiments, the improved pillars include cap portions that respectively electrically connect to bump pads disposed in respective through holes of a dielectric layer. Such a configuration may significantly reduce stress components of, for example, a thermal stress in a direction perpendicular and/or parallel to an extension or lengthwise direction of the pillars. The lateral stress tolerance may be increased and thus a size of the pillars and bump pads can be made smaller, thereby yielding a more compact semiconductor package. In addition, the pillars are disposed in the through holes of the dielectric layer, and thus, the solder at the tip of a pillar will not contact the solder at the tip of the adjacent pillar. Further, even if the pillars are bent, two adjacent pillars will not contact and electrically connect to each other.

FIG. 1 illustrates an example of a semiconductor package 1 according to some embodiments of the present disclosure. The semiconductor package 1 includes a substrate 2, a dielectric layer 3, at least one conductive pillar 4, an electrical device 5 and an isolation material 6.

The substrate 2 includes a first surface 21, a second surface 22, a main body 20, a first conductive structure 23 and a second conductive structure 25. The material of the main body 20 of the substrate 2 may include, for example, organic material, silicon or glass. The substrate 2 may be or may include an interposer. The main body 20 includes a first surface 201 and a second surface 202 opposite to the first surface 201. The first conductive structure 23 is disposed on the first surface 201 of the main body 20, and includes at least one first patterned circuit layer 24 such as a redistribution layer (RDL) embedded in at least one first insulation layer 231. The first patterned circuit layer 24 includes at least one first pad 241 (e.g., a bump pad) exposed from the top surface of the first conductive structure 23 (e.g., the first surface 21 of the substrate 2). The second conductive structure 25 is disposed on the second surface 202 of the main body 20, and includes at least one second patterned circuit layer 26 such as an RDL embedded in at least one second insulation layer 251. The second patterned circuit layer 26 includes at least one second pad 261 (e.g., a ball pad) exposed from the bottom surface of the second conductive structure 25 (e.g., the second surface 22 of the substrate 2). Optionally, at least one solder ball 262 may be formed adjacent to the bottom surface of the second conductive structure 25 (e.g., the second surface 22 of the substrate 2) and electrically connected to the second pad 261 (e.g., the ball pad).

The dielectric layer 3 is disposed on the top surface of the first conductive structure 23 (e.g., the first surface 21 of the substrate 2) and defines at least one through hole 33 extending through the dielectric layer 3 and corresponding to the respective first pad 241 (e.g., in that the first pad 241 is disposed in the through hole 33). The dielectric layer 3 may include, or be formed from, for example, a cured photoimageable dielectric (PID) material such as epoxy or polyimide (PI) with photoinitiators. In at least one embodiment, the dielectric layer 3 is formed of a single material and is a monolithic structure. However, in other embodiments, the dielectric layer 3 may be a multi-layered structure.

As shown in FIG. 1, the dielectric layer 3 includes a top surface 31. The through hole 33 includes an upper portion 331 close to the top surface 31 of the dielectric layer 3 and a main portion 332 farther away from the top surface 31 of the dielectric layer 2 than the upper portion 331. The main portion 332 has a substantially consistent width, and a width of the upper portion 331 decreases (e.g., decreases monotonically or tapers) with increasing distance from the top surface 31 of the dielectric layer 3. A sidewall of the upper portion 331 of the through hole 33 may be a curved line (e.g., a quarter-circle shape) from a cross-sectional view. However, in one or more embodiments, the sidewall of the upper portion 331 of the through hole 33 may be a slanted line (e.g., a straight line forming a flat surface) from a cross-sectional view.

The conductive pillar 4 is disposed in the respective through hole 33. The conductive pillar 4 includes a body portion 41, a cap portion 42 and a base portion 43. The material of the conductive pillar 4 may include, for example, copper or another metal or metal alloy or other electrically conductive material. One end of the body portion 41 is physically connected to the base portion 43, and one other end of the body portion 41 is physically connected to the cap portion 42. In some embodiments, the body portion 41 of the conductive pillar 4 and the cap portion 42 of the conductive pillar 4 are formed concurrently and integrally as a monolithic structure. The base portion 43 is electrically connected to the electrical device 5, and the cap portion 42 is electrically connected to the first pad 241 of the first patterned circuit layer 24.

In the embodiments shown in FIG. 1, an intermediate layer 27 is optionally formed on the first pad 241 in the through hole 33 of the dielectric layer 3, and the material of the intermediate layer 27 may include, for example, conductive metal such as copper or another metal or metal alloy or other electrically conductive material. Further, a bonding layer 28 is formed on the intermediate layer 27, and the material of the bonding layer 28 may include, for example, solder. The cap portion 42 of the conductive pillar 4 is embedded in or bonded to the bonding layer 28, or the cap portion 42 of the conductive pillar 4 may contact the bonding layer 28. However, it is noted that the intermediate layer 27 may be omitted in some embodiments, and the bonding layer 28 may directly contact the first pad 241. In addition or alternatively, the bonding layer 28 may be omitted in some embodiments. In at least one embodiment, a height of the conductive pillar 4 is slightly less than a thickness of the dielectric layer 3 such that the top surface 31 of the dielectric layer 3 contacts the electrical device 5.

The electrical device 5 is disposed on the dielectric layer 3 and electrically connected to the body portion 41 of the conductive pillar 4 (e.g., via the base portion 43). The electrical device 5 (e.g., a semiconductor chip) includes a first surface 51, a second surface 52 opposite to the first surface 51, a main body 50 and a third conductive structure 53. The first surface 51 is a backside surface, and the second surface 52 is an active surface. The material of the main body 50 may include, for example, silicon. The main body 50 includes a first surface 501 and a second surface 502 opposite to the first surface 501. The third conductive structure 53 is disposed on the second surface 502 of the main body 50, and includes at least one third patterned circuit layer 54 such as an RDL embedded in at least one third insulation layer 531. The third patterned circuit layer 54 includes at least one third pad 541 exposed from the bottom surface of the third conductive structure 53 (e.g., the second surface 52 of the electrical device 5). In at least one embodiment, the base portion 43 of the conductive pillar 4 is physically connected to the third pad 541 of the third patterned circuit layer 54 (e.g., the conductive pillar 4 stands on the third pad 541). In at least one embodiment, the bottom surface of the third conductive structure 53 (e.g., the second surface 52 of the electrical device 5) may contact the top surface 31 of the dielectric layer 3.

The isolation material 6 is disposed in the through hole 33 and fills the gap between a sidewall of the through hole 33 and the conductive pillar 4, surrounding and protecting the conductive pillar 4. The material of the isolation material 6 may include, for example, an underfill, a non-conductive film (NCF) or a non-conductive paste (NCP). In some embodiments, the bottom surface of the third conductive structure 53 (e.g., the second surface 52 of the electrical device 5) may not contact the top surface 31 of the dielectric layer 3, and the isolation material 6 may be further disposed in the space between the bottom surface of the third conductive structure 53 (e.g., the second surface 52 of the electrical device 5) and the top surface 31 of the dielectric layer 3.

Figure 2:
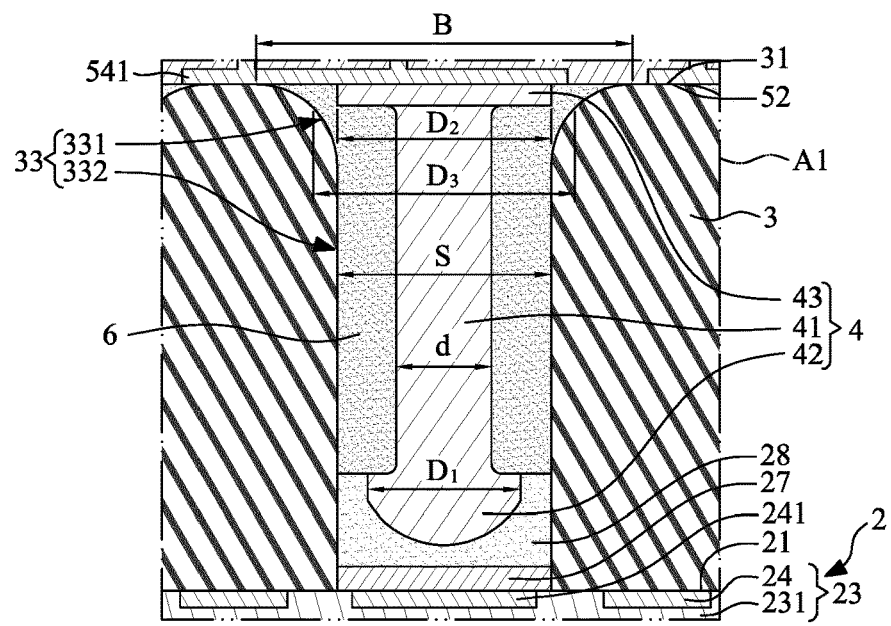
FIG. 2 illustrates an enlarged cross-sectional view of a region "A1" shown in FIG. 1 according to some embodiments of the present disclosure.

FIG. 2 illustrates an enlarged cross-sectional view of the region "A1" shown in FIG. 1 according to some embodiments of the present disclosure. A maximum width of the cap portion 42 of the conductive pillar 4 is specified as "$D_1$", a maximum width of the body portion 41 of the conductive pillar 4 is specified as "d", and a maximum width of the base portion 43 of the conductive pillar 4 is specified as "$D_2$". $D_1$ is greater than d, and $D_2$ is greater than d. Thus, the conductive pillar 4 is substantially in an "I" shape. As shown in FIG. 2, the bottom surface of the cap portion 42 of the conductive pillar 4 is a curved surface and forms a substantially mushroom shape. However, in some embodiments, the bottom surface of the cap portion 42 of the conductive pillar 4 may be a flat surface or a surface having another shape.

The main portion 332 of the through hole 33 has a substantially consistent width S. A width of the upper portion 331 of the through hole 33 is specified as "$D_3$", and $D_3$ decreases (e.g., decreases monotonically) with increasing distance from the top surface 31 of the dielectric layer 3. A maximum width B (e.g., the maximum value of $D_3$) of the upper portion 331 of the through hole 33 is greater than a maximum width S of the main portion 332 of the through hole 33. In addition, the maximum width $D_1$ of the cap portion 42 of the conductive pillar 4 is in a range of about 0.65×S to about 0.75×S, and the maximum width d of the body portion 41 of the conductive pillar 4 is in a range of about 0.5×S to about 0.65×S. In some embodiments, the maximum width $D_2$ of the base portion 43 of the conductive pillar 4 is substantially equal to a maximum width S of the main portion 332 of the through hole 33. In some embodiments, the maximum width $D_1$ of the cap portion 42 is greater than the maximum width d of the body portion 41, such as greater than about 1.1× or greater, or about 1.15× or greater, about 1.2× or greater, or about 1.3× or greater.

As shown in the embodiment illustrated in FIG. 1 and FIG. 2, such a configuration may significantly reduce stress components of a thermal stress in a direction perpendicular and/or parallel to an extension or lengthwise direction of the conductive pillar 4. The present disclosure provides for structures having sufficient lateral stress tolerance to significantly improve capability of avoiding or minimizing warpage of bonding between the electrical device 5 and the substrate 2. The lateral stress tolerance may be increased and thus a size of the conductive pillar 4 and the first pad 241 can be made smaller, thereby yielding a more compact semiconductor package. For example, the I/O count of such a semiconductor package may be greater than 2,000.

In addition, the conductive pillars 4 are respectively disposed in the respective through holes 33 of the dielectric layer 3, and thus, the bonding layer 28 at the respective tips of the conductive pillars 4 will not contact the bonding layer 28 at the tips of the respective adjacent conductive pillars 4. Further, even if the conductive pillars 4 are bent, two adjacent conductive pillars 4 will not contact and electrically connect with each other. In some embodiments, two adjacent conductive pillars 4 and bonding layers 28 are separated by the dielectric layer 3, and a thickness of the dielectric layer 3 may be greater than about one half of a height of the conductive pillar 4. Thus, the thick dielectric layer 3 can help to prevent a conductive bridge, such as a solder bridge or a pillar bridge, from forming between the two adjacent conductive pillars 4 and bonding layers 28. In addition, the overall thickness of the semiconductor package 1 may be significantly reduced. For example, the overall thickness of the semiconductor package 1 may be less than about 0.2 mm.

Figure 3:
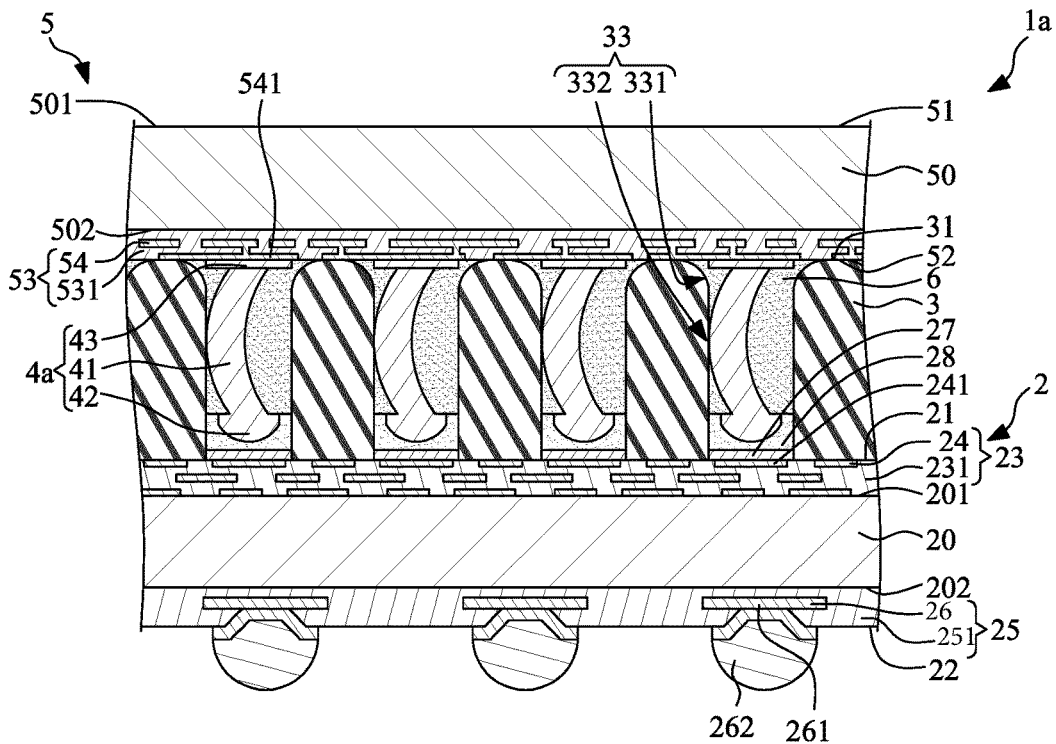
FIG. 3 illustrates an example of a semiconductor package according to some embodiments of the present disclosure.

FIG. 3 illustrates an example of a semiconductor package 1a according to some embodiments of the present disclosure. The semiconductor package 1a of FIG. 3 is similar to the semiconductor package 1 as shown in FIG. 1, except that the conductive pillars 4a are bent due to a compression force. In other embodiments, not all pillars 4a are bent (e.g., a subset of the pillars 4a may be bent, or some number of the pillars 4a of one or more but less than a total number of pillars 4a may be bent). The body portion 41 of the conductive pillar 4a is bent and, in the depicted embodiments, forms a curve, and a sidewall of the bent body portion 41 of the conductive pillar 4a contacts a sidewall of the main portion 332 of the through hole 33. In these embodiments, a bridge between two adjacent conductive pillars 4a will not form. The conductive pillars 4 and the bonding layers 28 are restricted to the respective through holes 33 of the dielectric layer 3.

Figure 4:
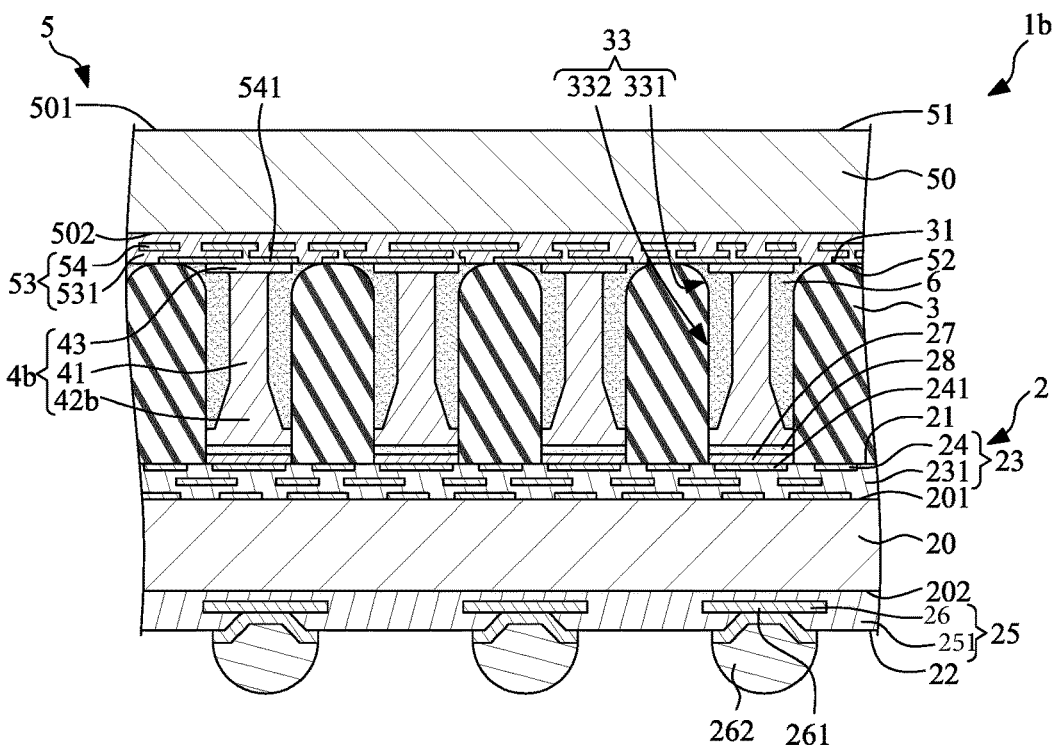
FIG. 4 illustrates an example of a semiconductor package according to some embodiments of the present disclosure.

FIG. 4 illustrates an example of a semiconductor package 1b according to some embodiments of the present disclosure. The semiconductor package 1b of FIG. 4 is similar to the semiconductor package 1 as shown in FIG. 1, except that the cap portion 42b of the conductive pillar 4b is in a stud-shape. It is noted that the material of the cap portion 42b of the conductive pillar 4b may include, for example, a solder material which is different from the material of the body portion 41 of the conductive pillar 4b.

Figure 5:
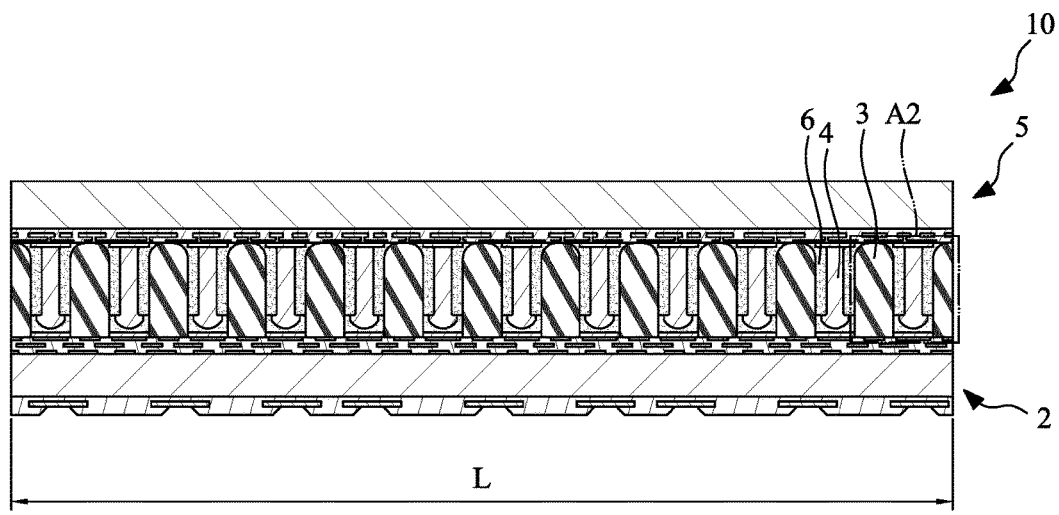
FIG. 5 illustrates an example of a semiconductor package according to some embodiments of the present disclosure before being heated.
Figure 6:
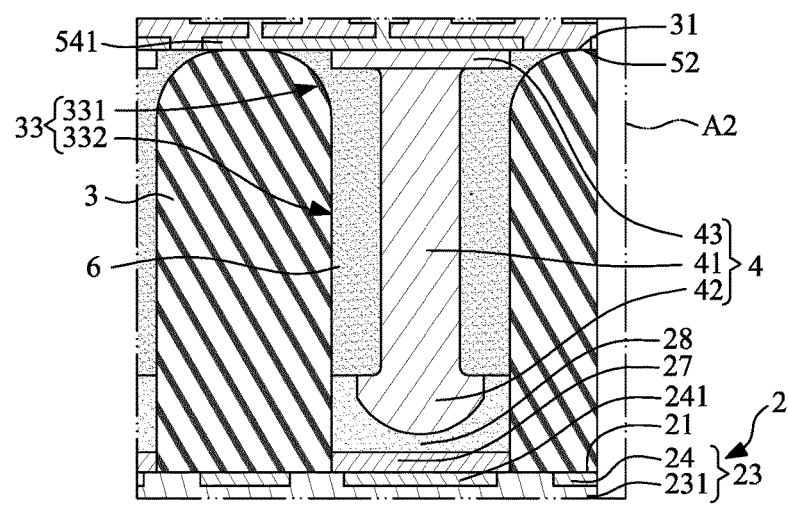
FIG. 6 illustrates an enlarged cross-sectional view of a region "A2" shown in FIG. 5.

FIG. 5 illustrates an example of a semiconductor package 10 according to some embodiments of the present disclosure before being heated. FIG. 6 illustrates an enlarged cross-sectional view of a region "A2" shown in FIG. 5. The semiconductor package 10 may include a substrate 2, a dielectric layer 3, a plurality of conductive pillars 4, an electrical device 5 and an isolation material 6. The substrate 2 and the electrical device 5 may be a wafer type or a panel type. The substrate 2 has a length L.

Figure 7:
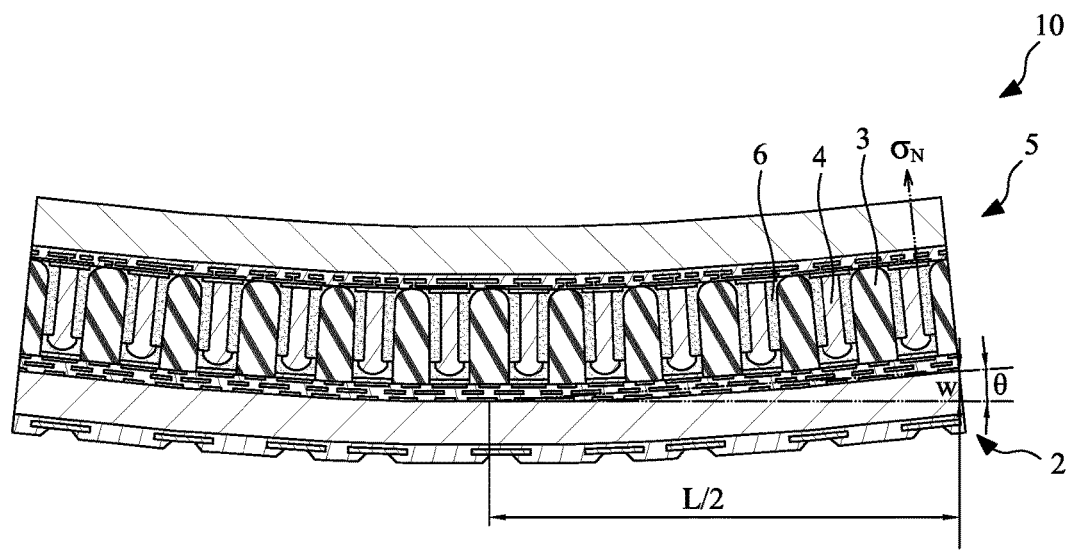
FIG. 7 illustrates an example of deformation of the semiconductor package shown in FIG. 5 if warpage occurs after being heated.
Figure 8:
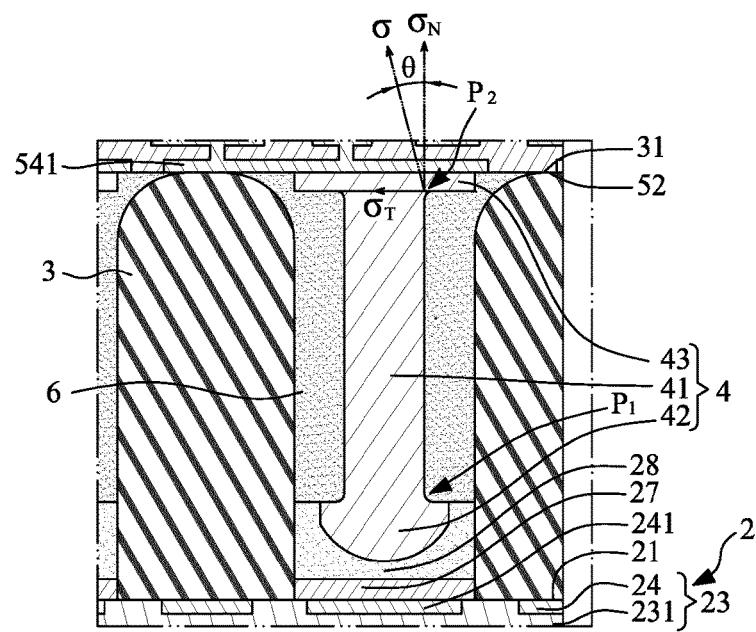
FIG. 8 illustrates an example of force distribution on a conductive pillar when warpage does not occur.

FIG. 7 illustrates an example of deformation of the semiconductor package 10 if warpage occurs after being heated. FIG. 8 illustrates an example of force distribution on the conductive pillar 4 when warpage does not occur. Referring to FIG. 7 and FIG. 8, when the semiconductor package 10 is heated, warpage of the semiconductor package 10 may occur due to a thermal stress ($\sigma$) occurring at a corner point $P_2$ (the corner point between the body portion 41 of the conductive pillar 4 and the base portion 43 of the conductive pillar 4, see FIG. 8) of the conductive pillar 4. The thermal stress ($\sigma$) occurring at the point $P_2$ can be expressed as below:

$$\sigma = (\alpha_P - \alpha_B) \cdot \Delta T \cdot E_P \cdot E_B \cdot A_P / (E_P \cdot A_P + E_B \cdot A_B) \quad (1)$$

where $\alpha_P$ and $\alpha_B$ are coefficients of thermal expansion (CTE) for the conductive pillar 4 and the isolation material 6, respectively, $E_P$ and $E_B$ are coefficients of Young's modulus for the conductive pillar 4 and the isolation material 6, respectively, $\Delta T$ is a temperature difference between a temperature before the semiconductor package 10 being heated (FIG. 5) and a temperature after the semiconductor package 10 being heated (FIG. 7), and $A_P$ and $A_B$ are cross-sectional areas of the conductive pillar 4 and the isolation material 6, respectively, in the semiconductor package 10 along a vertical direction. That is, $A_P$ is an entire area of the lateral side surface of the conductive pillar 4, and $A_B$ is an entire surface area of the isolation material 6 that is disposed on the lateral side surface of the conductive pillar 4.

Referring to FIG. 8, which depicts a structure in which warpage of the semiconductor package 10 does not actually occur, the thermal stress ($\sigma$) occurs at the point $P_2$ of the conductive pillar 4. That is, the conductive pillar 4 sustains the thermal stress ($\sigma$) without warpage occurring. The inclination $\theta$ is the angle between the direction of the thermal stress ($\sigma$) and the vertical direction (e.g., y direction in FIG. 8), where $\theta$ is the warpage angle. The tangent components ($\sigma_T$) and normal component ($\sigma_N$) of the thermal stress ($\sigma$) may be expressed as below:

$$\sigma_T = \sigma \cdot \sin\theta, \text{ and}$$

$$\sigma_N = \sigma \cdot \cos\theta \quad (2)$$

Referring to FIG. 7, the thermal stress ($\sigma$) is in a direction parallel to a radial direction of a warpage curve of the semiconductor package 10. The relationship of the warpage W, the length L of the substrate 2 (or the semiconductor package 10) and warpage angle ($\theta$) can be expressed as below:

$$\tan\theta = 2W/L, \text{ and}$$

$$W = (L/2) \cdot \tan\theta \quad (3).$$

The tangent component ($\sigma_T$) of the thermal stress ($\sigma$) at the point $P_2$ should satisfy the following conditions:

$$K_2 \cdot \sigma_T = K_2 \cdot \sigma \cdot \sin\theta \lesssim S_P, \text{ and}$$

$$\theta \lesssim \sin^{-1}[S_P/(K_2\sigma)] \quad (4)$$

where $K_2$ is the stress concentration factor at the corner between the body portion 41 of the conductive pillar 4 and the base portion 43 of the conductive pillar 4 (at the point $P_2$), and $S_P$ is a material strength of the conductive pillar 4.

According to principles of stress theory, the stress concentration factor $K_2$ in equation (4) will be greater than about 1.2, or less than about 3.0, or in a range between about 1.4 and about 3.0, for $D_2 > d$, and $r_2/d$ between about 0.02 and about 0.35 for conductive pillar 4 of FIGS. 6 and 8, where $D_2$ is the maximum width of the base portion 43 of the conductive pillar 4, d is the maximum width of the body portion 41 of the conductive pillar 4, and $r_2$ is the radius of the conductive pillar 4 at the point $P_2$.

Similarly, the tangent component ($\sigma_T$) of the thermal stress ($\sigma$) at the point $P_1$ (the corner point between the body portion 41 of the conductive pillar 4 and the cap portion 42 of the conductive pillar 4, see FIG. 8) should satisfy the following:

$$K_1 \cdot \sigma_T = K_1 \cdot \sigma \cdot \sin\theta \lesssim S_P, \text{ and}$$

$$\theta \lesssim \sin^{-1}[S_P/(K_1\sigma)] \quad (5)$$

where $K_1$ is the stress concentration factor at the corner between the body portion 41 of the conductive pillar 4 and the cap portion 42 of the conductive pillar 4 (at the point $P_1$).

According to principles of stress theory, the stress concentration factor $K_1$ in equation (5) will be greater than about 1.2, or less than about 3.0, or in a range between about 1.4 and about 3.0, for $D_1 > d$, and $r_1/d$ between about 0.02 and about 0.35 for conductive pillar 4 of FIGS. 6 and 8, where $D_1$ is the maximum width of the cap portion 42 of the conductive pillar 4, d is the maximum width of the body portion 41 of the conductive pillar 4, and $r_1$ is the radius of the conductive pillar 4 at the point $P_1$.

In addition, $$\sigma_N = \sigma \cdot \cos\theta \lesssim S_B \cdot (1 - A/R), \text{ and}$$

$$\theta \lesssim \cos^{-1}[S_B \cdot (1 - A/R)/\sigma]\} \quad (6)$$

where $S_B$ is a material strength of the isolation material 6, and A is a sum of areas of all conductive pillars 4, that is, A=(number of conductive pillars 4)×(area of each of the conductive pillars 4), and R is total area of the electrical device 5.

Substituting e of equation (4) into equation (3) results in equation (7), substituting e of equation (5) into equation (3) results in equation (8), and substituting e of equation (6) into equation (3) results in equation (9). Thus, the warpage W of the substrate 2 (or the semiconductor package 10) satisfies at least one of the following equations.

$$W \leq (L/2) \cdot \tan\{\sin^{-1}[S_P/(K_2\sigma)]\} \quad (7)$$

$$W \leq (L/2) \cdot \tan\{\sin^{-1}[S_P/(K_1\sigma)]\} \quad (8)$$

$$W \leq (L/2) \cdot \tan\{\cos^{-1}[S_B \times (1 - A/R)/\sigma]\} \quad (9)$$

Equations (7), (8) and (9) indicate that the warpage W sustainable by the semiconductor package components could be dictated by a geometric design of the conductive pillar 4 (e.g., by the maximum width $D_1$ of the cap portion 42, the maximum width d of the body portion 41, the radius $r_1$ of the conductive pillar 4 at the point $P_1$, the maximum width $D_2$ of the base portion 43, and the radius $r_2$ of the conductive pillar 4 at the point $P_2$, and so forth) and by a selected material for the conductive pillar 4. In optimizing design (e.g., process control on temperature, selection of a material for the conductive pillar 4, manufacturing or designing a structure with reduced concentration factor, and so forth), equations (7), (8) and (9) can be used to estimate a warpage W of the semiconductor package 10 (e.g., can formulate a design rule).

Figure 9:
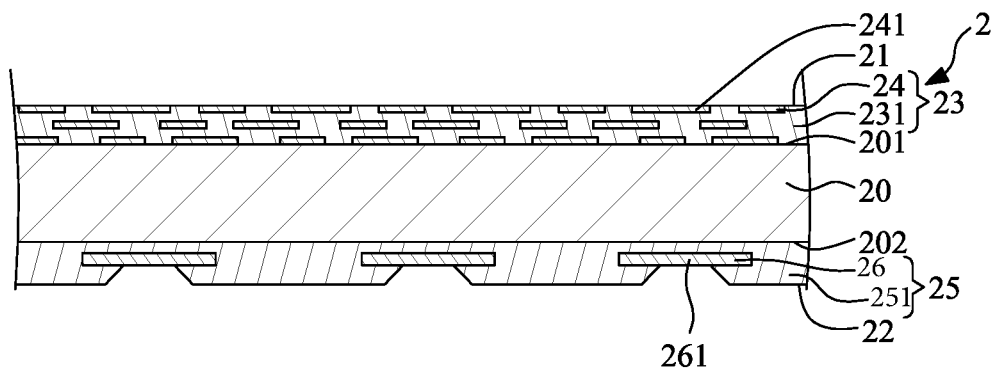
FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23 and FIG. 24 illustrate a semiconductor manufacturing process according to some embodiments of the present disclosure.

FIGS. 9-24 illustrate a semiconductor manufacturing process according to some embodiments of the present disclosure. In the illustrated embodiments, the semiconductor manufacturing process is used to manufacture a semiconductor package such as the semiconductor package 1 as shown in FIG. 1. Referring to FIG. 9, a substrate 2 is provided. The substrate 2 includes a first surface 21, a second surface 22, a main body 20, a first conductive structure 23 and a second conductive structure 25. The material of the main body 20 of the substrate 2 may include, for example, organic material, silicon or glass. The substrate 2 may be an interposer. The main body 20 includes a first surface 201 and a second surface 202 opposite to the first surface 201. The first conductive structure 23 is disposed on the first surface 201 of the main body 20, and includes at least one first patterned circuit layer 24 such as an RDL embedded in at least one first insulation layer 231. The first patterned circuit layer 24 includes at least one first pad 241 (e.g., a bump pad) exposed from the top surface of the first conductive structure 23 (e.g., the first surface 21 of the substrate 2). The second conductive structure 25 is disposed on the second surface 202 of the main body 20, and includes at least one second patterned circuit layer 26 such as an RDL embedded in at least one second insulation layer 251. The second patterned circuit layer 26 includes at least one second pad 261 (e.g., a ball pad) exposed from the bottom surface of the second conductive structure 25 (e.g., the second surface 22 of the substrate 2).

Figure 10:
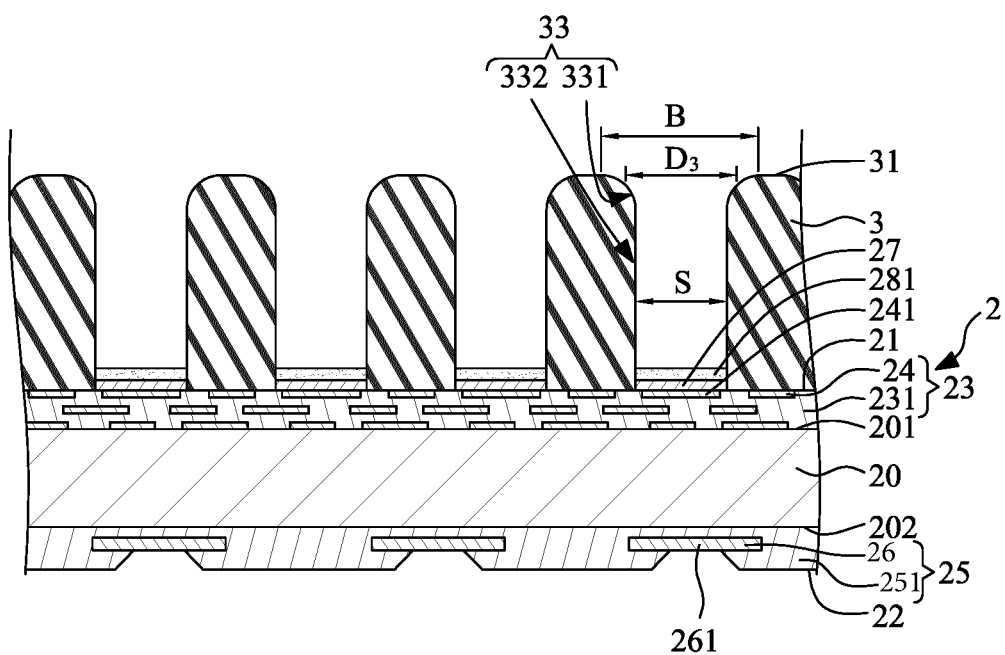

Referring to FIG. 10, a dielectric layer 3 is formed on the substrate 2. The dielectric layer 3 is disposed on the top surface of the first conductive structure 23 (e.g., the first surface 21 of the substrate 2). The dielectric layer 3 may include, or be formed from, a cured PID material such as epoxy or PI with photoinitiators. In at least one embodiment, the dielectric layer 3 is formed of a single material and is a monolithic structure. However, in other embodiments, the dielectric layer 3 may be a multi-layered structure. As shown in FIG. 10, the dielectric layer 3 includes a top surface 31.

Then, at least one through hole 33 is formed in the dielectric layer 3 which exposes the respective first pad 241. The dielectric layer 3 defines at least one through hole 33 extending through the dielectric layer 3 and corresponding to the respective first pad 241. The through hole 33 includes an upper portion 331 close to the top surface 31 of the dielectric layer 3 and a main portion 332 farther away from the top surface 31 of the dielectric layer 2 than the upper portion 331. The main portion 332 has a substantially consistent width, and a width of the upper portion 331 decreases (e.g., decreases monotonically) with increasing distance from the top surface 31 of the dielectric layer 3. A sidewall of the upper portion 331 of the through hole 33 may be a curved line (e.g., a quarter-circle shape) from a cross-sectional view. However, in one or more embodiments, the sidewall of the upper portion 331 of the through hole 33 may be a slanted line (e.g., a straight line forming a flat surface) from a cross-sectional view.

The main portion 332 of the through hole 33 has a substantially consistent width S. A width of the upper portion 331 of the through hole 33 is specified as "$D_3$", and $D_3$ decreases (e.g., decreases monotonically) with increasing distance from the top surface 31 of the dielectric layer 3. A maximum width B (i.e., the maximum value of $D_3$) of the upper portion 331 of the through hole 33 is greater than a maximum width S of the main portion 332 of the through hole 33.

Optionally, an intermediate layer 27 may be formed on the first pad 241 in the through hole 33 of the dielectric layer 3, and the material of the intermediate layer 27 includes a conductive metal such as copper or another metal or metal alloy or other electrically conductive material. Further, a first bonding material 281 is formed on the intermediate layer 27, and the material of the first bonding material 281 may include, for example, solder.

Figure 11:
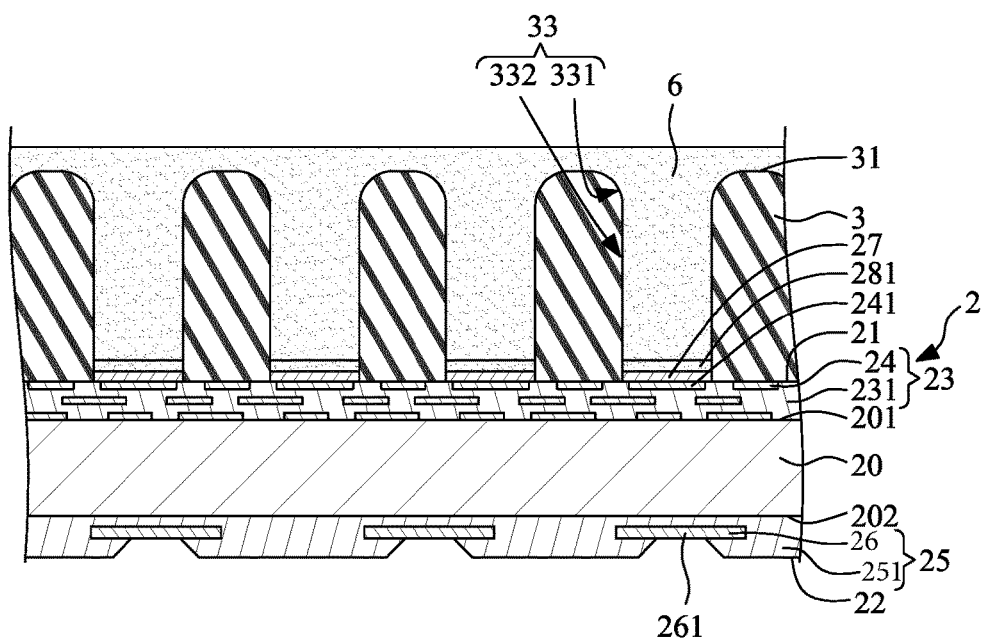

Referring to FIG. 11, an isolation material 6 in a liquid state is applied to the through hole 33. The material of the isolation material 6 may include, for example, an underfill, a non-conductive film (NCF) or a non-conductive paste (NCP). In at least one embodiment, the isolation material 6 fills the through hole 33 and covers the top surface 31 of the dielectric layer 3.

Figure 12:
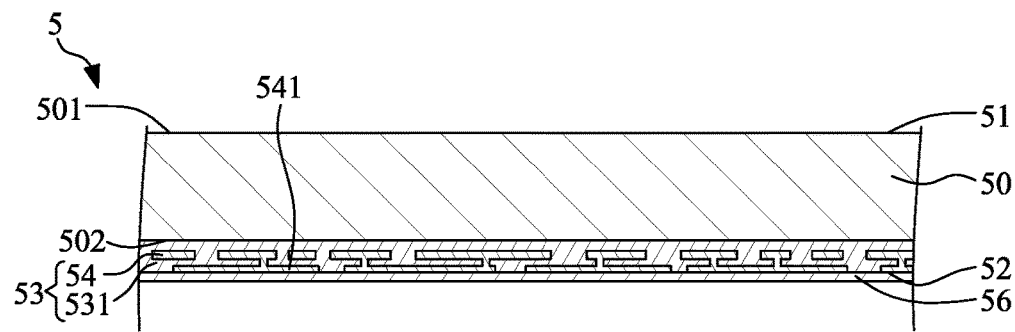

Referring to FIG. 12, an electrical device 5 is provided. The electrical device 5 (e.g., a semiconductor chip) includes a first surface 51, a second surface 52 opposite to the first surface 51, a main body 50 and a third conductive structure 53. The first surface 51 is a backside surface, and the second surface 52 is an active surface. The material of the main body 50 may include, for example, silicon. The main body 50 includes a first surface 501 and a second surface 502 opposite to the first surface 501. The third conductive structure 53 is disposed on the second surface 502 of the main body 50, and includes at least one third patterned circuit layer 54 such as an RDL embedded in at least one third insulation layer 531. The third patterned circuit layer 54 includes at least one third pad 541 exposed from the bottom surface of the third conductive structure 53 (e.g., the second surface 52 of the electrical device 5).

Then, a first conductive metal layer 56, which includes a material such as, for example, copper or another metal or metal alloy or other electrically conductive material, is formed on the bottom surface of the third conductive structure 53 (e.g., the second surface 52 of the electrical device 5) by, for example, sputtering so as to physically connect and electrically connect the third pad 541 of the third patterned circuit layer 54.

Figure 13:
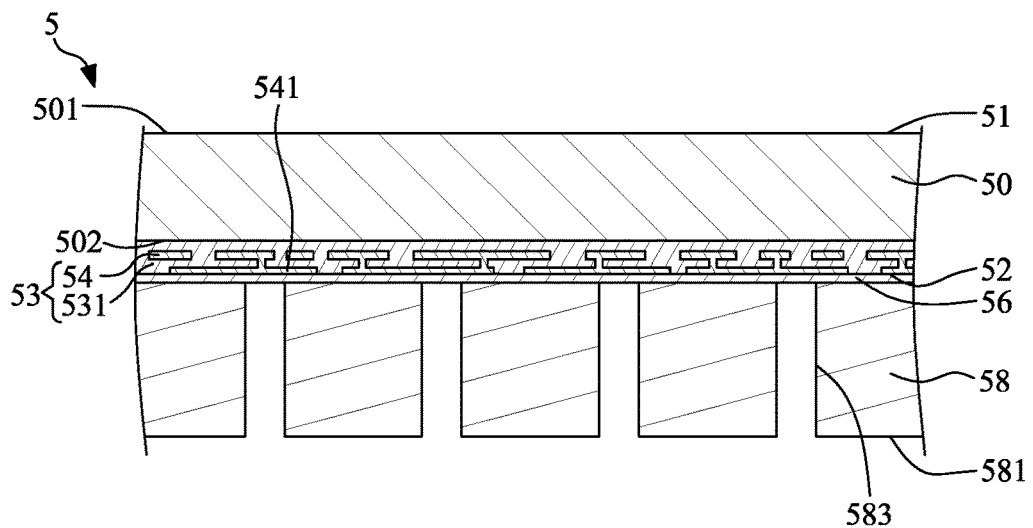

Referring to FIG. 13, a passivation layer 58 (e.g., a photoresist layer) is formed on the conductive metal layer 56. The passivation layer 58 has a bottom surface 581. Then, at least one opening 583 is formed in the passivation layer 58 which exposes a portion of the conductive metal layer 56.

Figure 14:
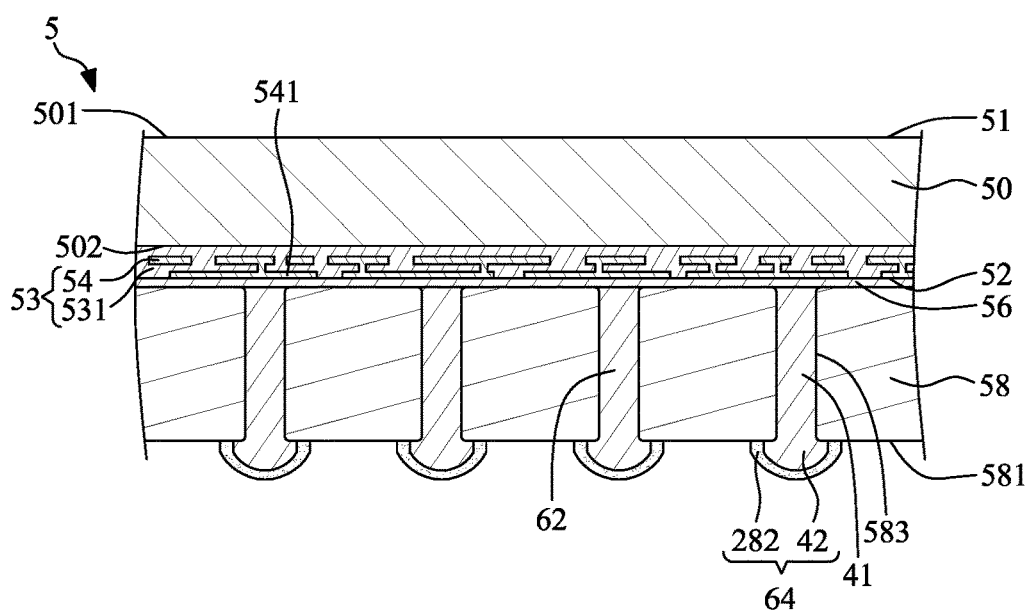

Referring to FIG. 14, a second conductive metal layer 62, which includes a material such as, for example, copper or another metal or metal alloy or other electrically conductive material, is formed in the opening 583 and on the bottom surface 581 of the passivation layer 58 by, for example, plating. The portion of the second conductive metal layer 62 in the opening 583 forms a body portion 41 of a conductive pillar 4, and the portion of the second conductive metal layer 62 on the bottom surface 581 of the passivation layer 58 forms a cap portion 42 of the conductive pillar 4. Then, a second bonding material 282 is formed on the cap portion 42 to form a head portion 64. The material of the second bonding material 282 may include, for example, solder.

Figure 15:
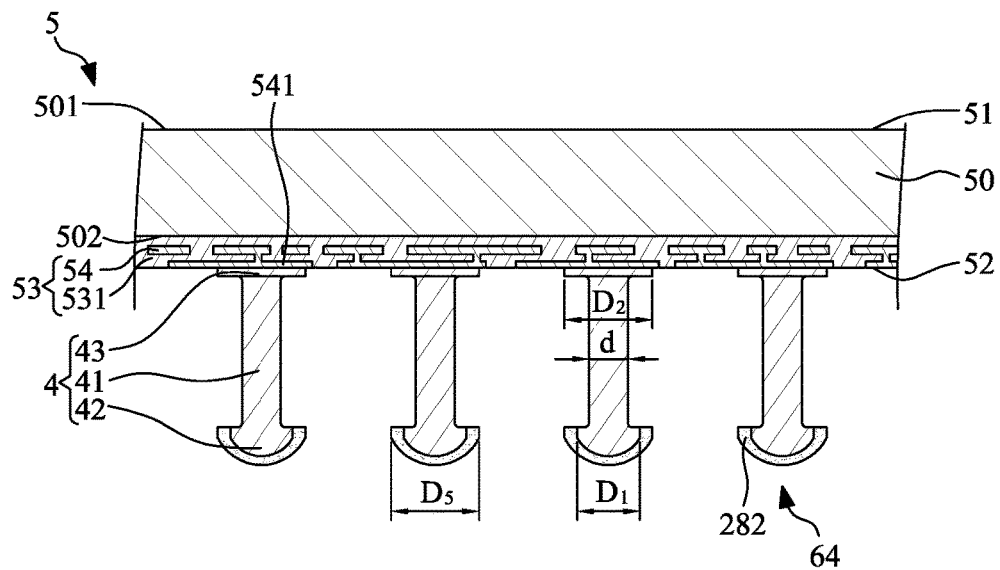

Referring to FIG. 15, the passivation layer 58 is removed by, for example, stripping. Then, portions of the first conductive metal layer 56 are removed by, for example, etching. The remaining portion of the first conductive metal layer 56 forms a base portion 43 of the conductive pillar 4. The body portion 41, the cap portion 42 and the base portion 43 constitute the conductive pillar 4. The base portion 43 of the conductive pillar 4 is physically connected to the third pad 541 of the third patterned circuit layer 54. In the depicted embodiment, the conductive pillar 4 stands on the third pad 541.

A maximum width of the cap portion 42 of the conductive pillar 4 is specified as "$D_1$", a maximum width of the body portion 41 of the conductive pillar 4 is specified as "d", and a maximum width of the base portion 43 of the conductive pillar 4 is specified as "$D_2$". $D_1$ is greater than d, and $D_2$ is greater than d. Thus, the conductive pillar 4 is substantially in an "I" shape. The bottom surface of the cap portion 42 of the conductive pillar 4 is a curved surface and forms a mushroom shape. In some embodiments, the maximum width $D_2$ of the base portion 43 of the conductive pillar 4 is substantially equal to a maximum width S (as depicted in FIG. 10) of the main portion 332 of the through hole 33. In addition, a maximum width of the head portion 64 is specified as "$D_5$". $D_5$ is substantially equal to $D_2$. The maximum width $D_1$ of the cap portion 42 of the conductive pillar 4 is in a range of about 0.65×S to about 0.75×S, and the maximum width d of the body portion 41 of the conductive pillar 4 is in a range of about 0.5×S to about 0.65×S.

Figure 16:
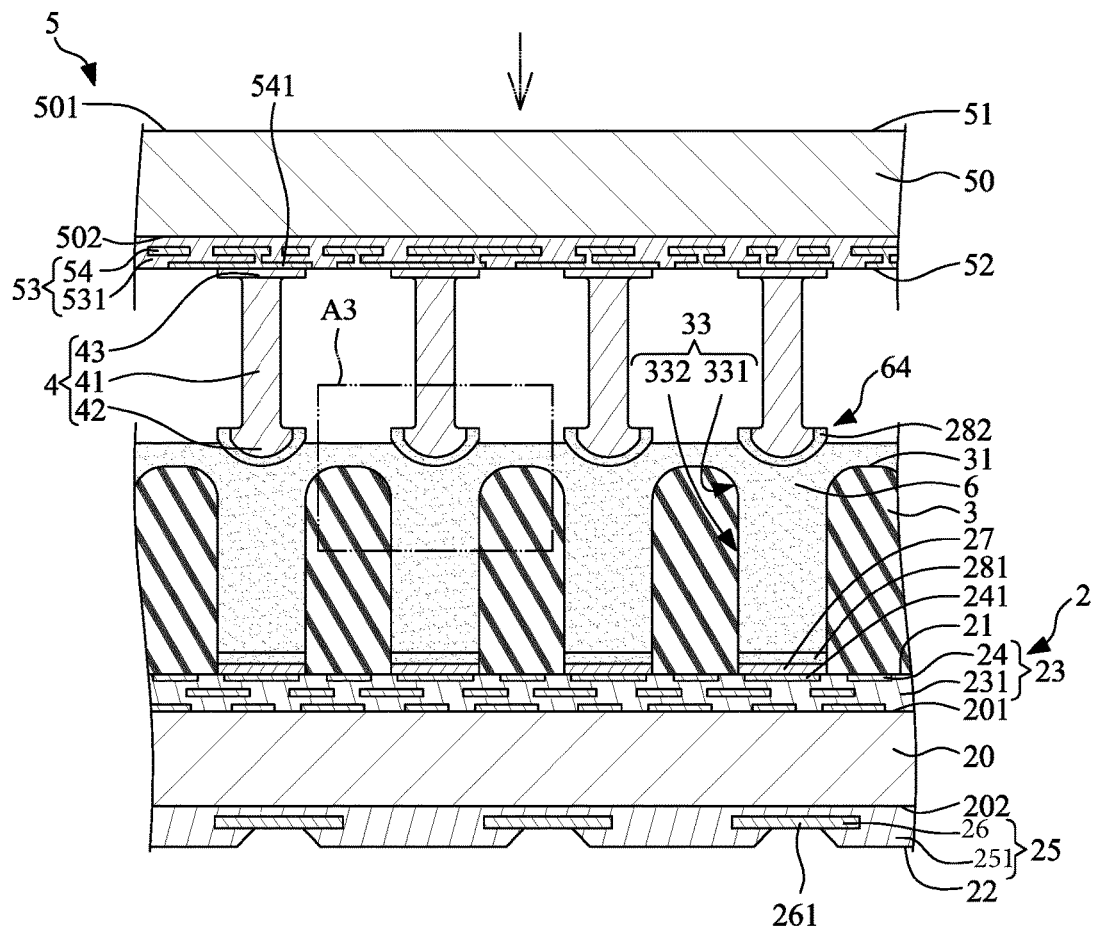

Referring to FIG. 16, the electrical device 5 is pressed toward the substrate 2, such that the conductive pillar 4 is inserted in the respective through hole 33, and the cap portion 42 of the conductive pillar 4 is electrically connected to the first pad 241. In at least one embodiment, the substrate 2 is heated to a temperature such that the first bonding material 281 is in a molten state, and the electrical device 5 is not heated. That is, a reflow process is not performed, and thus warpage is reduced.

Figure 17:
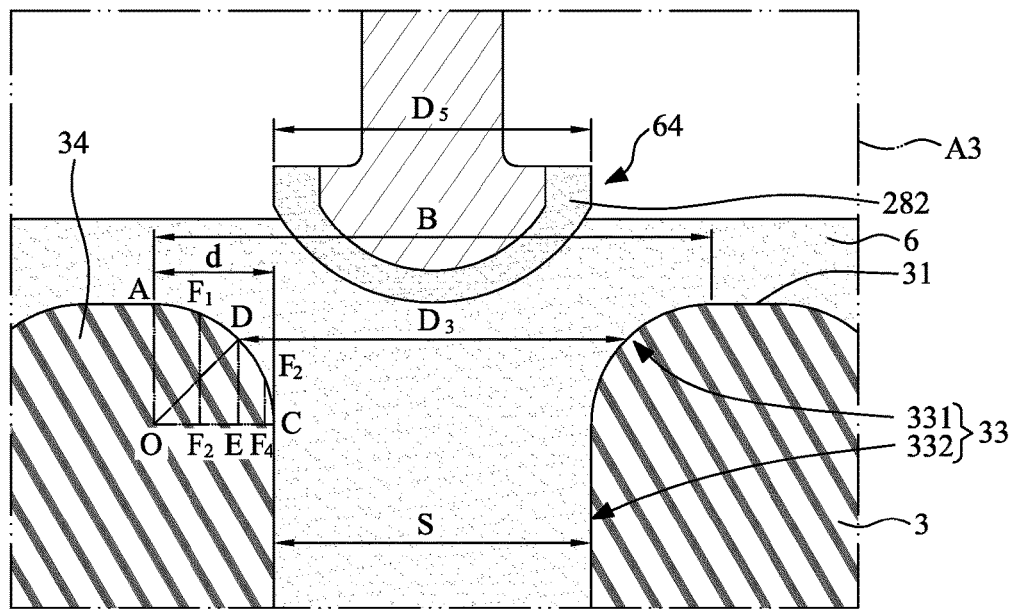

Referring to FIG. 17, an enlarged cross-sectional view of a region "A3" shown in FIG. 16 is illustrated. An upper portion 34 of the dielectric layer 3 defines the upper portion 331 of the through hole 33. A curved portion of a surface of the upper portion 34 from a cross-sectional view has a center point "O", a radius "r", a top point "A", a middle point "D" and a lower point "C". That is, a sidewall of the upper portion 331 of the through hole 33 is a curved line with a curvature radius r from a cross-sectional view. The maximum width B (e.g., the maximum value of $D_3$) of the upper portion 331 of the through hole 33 correlates to a bonding accuracy of the conductive pillar 4, and the maximum width $D_5$ of the head portion 64 of the conductive pillar 4 is substantially equal to a maximum width S (FIG. 10) of the main portion 332 of the through hole 33.

During the bonding process, the head portion 64 of the conductive pillar 4 may contact the surface of the upper portion 34 of the dielectric layer 3 (e.g., the sidewall of the upper portion 331 of the through hole 33) at the points, for example, A, $F_1$, D, $F_3$ and C due to a tolerance of the positioning of the conductive pillar 4. The value of the tolerance of the conductive pillar 4 at one side is specified as d, wherein d=(B−S)/2. If during an insertion process the conductive pillar 4 contacts the surface of the upper portion 34 of the dielectric layer 3 at the point A (d=0), the conductive pillar 4 will likely not be inserted into the through hole 33. If the conductive pillar 4 contacts the surface of the upper portion 34 of the dielectric layer 3 at the point $F_1$ (a point at which d is equal to the length of line segment $OF_2$ which is less than the length of line segment OE), the conductive pillar 4 still will likely not be inserted into the through hole 33. If the conductive pillar 4 contacts the surface of the upper portion 34 of the dielectric layer 3 at the point D (d is equal to the length of line segment OE), the conductive pillar 4 will likely be inserted into the through hole 33. If the conductive pillar 4 contacts the surface of the upper portion 34 of the dielectric layer 3 at the point $F_3$ (a point at which d is equal to the length of line segment $OF_4$ which is greater than the length of line segment OE), the conductive pillar 4 will likely be inserted into the through hole 33. Thus, d should be equal to or greater the length of line segment OE. This can be represented by the condition d the length of line segment OE.

In the triangle DOE, the angle DOE is 45 degrees. The length of line segment OD is equal to r, and the length of line segment OE is equal to r/√2. Thus, $$(B-S)/2 \geq r/\sqrt{2}, \text{ and}$$

$$r \leq (B-S)/\sqrt{2} \qquad (10)$$

Therefore, the curvature radius r of the portion of the surface of the upper portion 34 (e.g., the sidewall of the upper portion 331 of the through hole 33) can be determined by or set according to equation (10).

Figure 18:
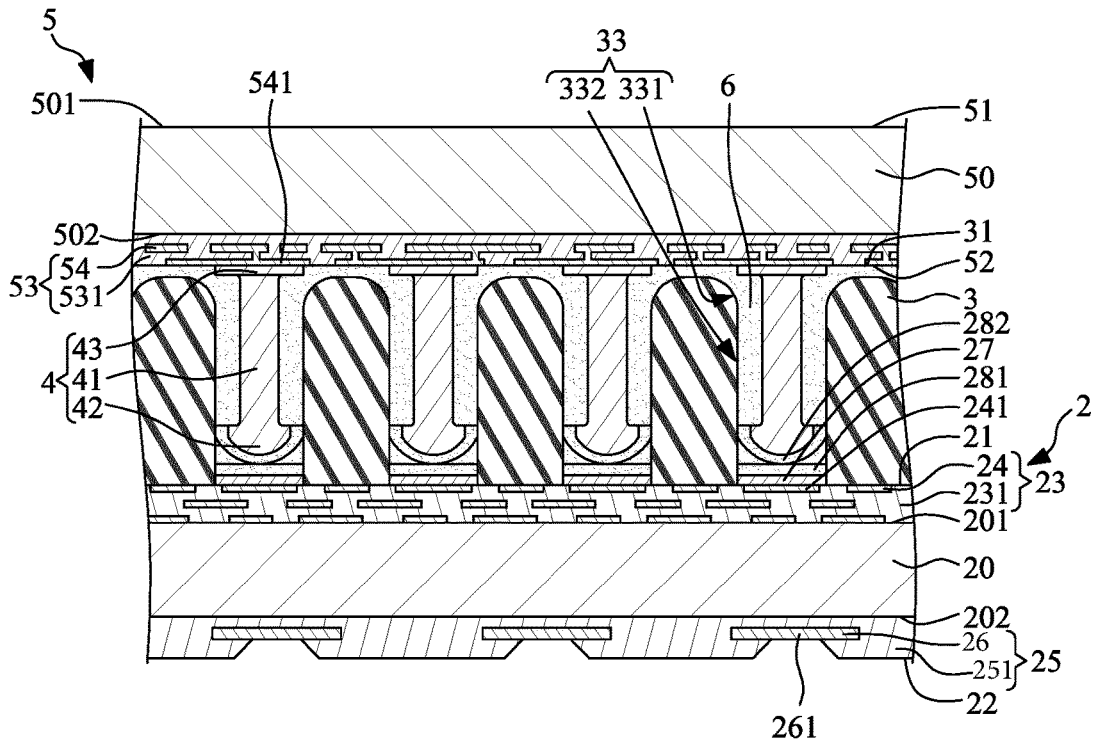

Referring to FIG. 18, the conductive pillar 4 is inserted in the respective through hole 33, and the second bonding material 282 on the cap portion 42 of the conductive pillar 4 contacts the first bonding material 281 on the intermediate layer 27 on the first pad 241. Since the head portion 64 of the conductive pillar 4 has a mushroom shape and the upper portion 34 of the dielectric layer 3 has a curved surface, the conductive pillar 4 is readily guided into the through hole 33. Thus, the inserting process can achieve high-accuracy alignment, or can have a high tolerance for misalignment. In addition, after the conductive pillar 4 has been inserted in the through hole 33, the conductive pillar 4 may not be readily pulled out because of a barb effect at the edge of the mushroom-shaped head portion 64 of the conductive pillar 4 (e.g., the flat portions of the mushroom-shaped head portion 64 may catch on or present a larger resistive surface area to, for example, a material that fills the through hole 33 if subjected to forces that work to pull the conductive pillar 4 out of the through hole 33). Thus, the yield rate of the manufacturing process may be improved.

Then, the second bonding material 282 on the cap portion 42 is melted, and the second bonding material 282 and the first bonding material 281 are fused together to form the bonding layer 28 as shown in FIG. 1. Thus, the cap portion 42 of the conductive pillar 4 is electrically connected to and bonded to the first pad 241. Such a process is referred to as a direct diffusion soldering process. Thus, a reflow process may be omitted, and warpage is reduced.

Figure 19:
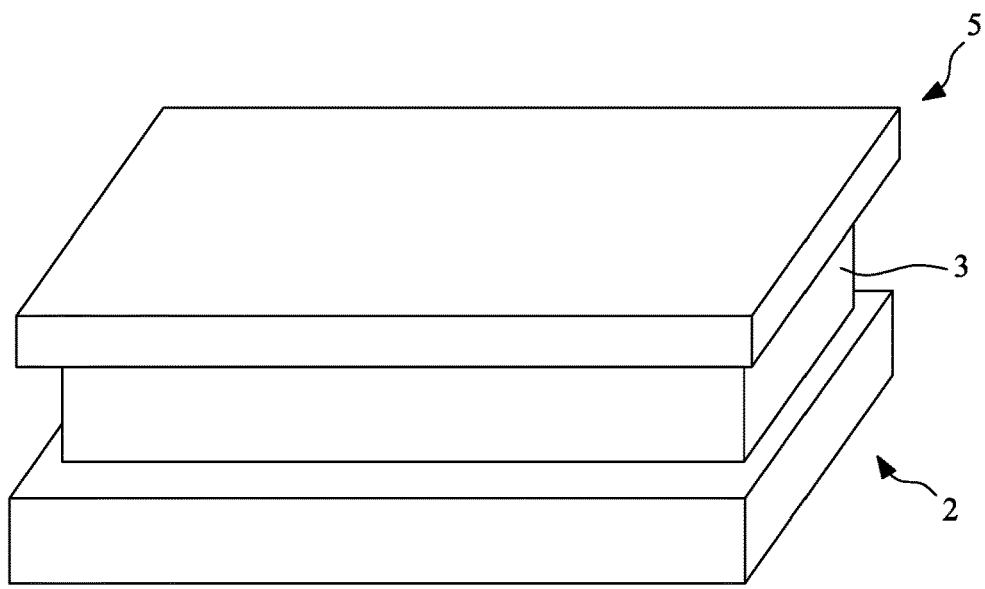

FIG. 19 illustrates a schematic perspective view of the substrate 2, the dielectric layer 3 and the electrical device 5 depicted in FIG. 18 according to some embodiments of the present disclosure. The substrate 2 and the electrical device 5 are both panel types.

Figure 20:
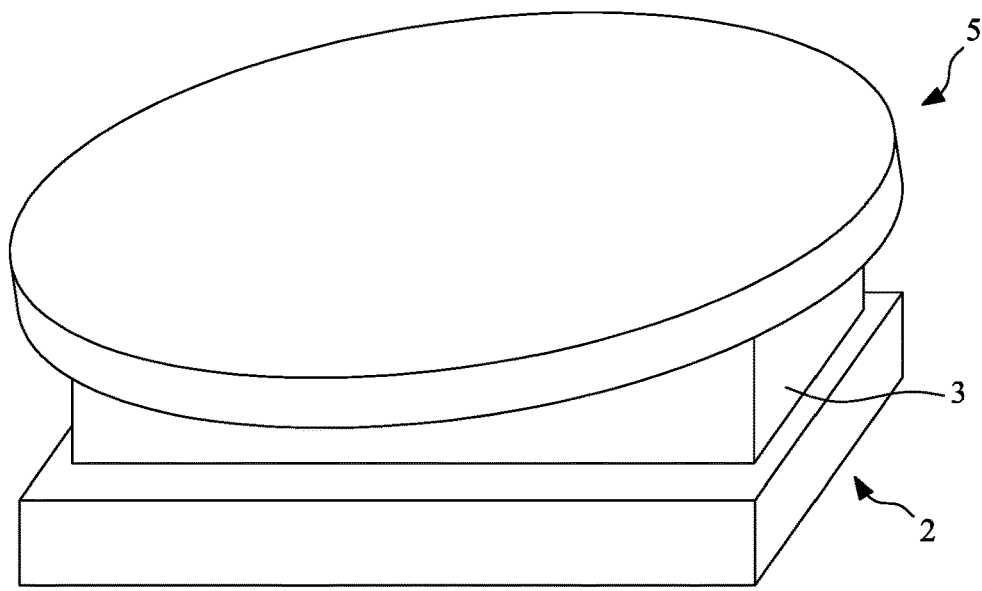

FIG. 20 illustrates a schematic perspective view of the substrate 2, the dielectric layer 3 and the electrical device 5 depicted in FIG. 18 according to some embodiments of the present disclosure. The substrate 2 is a panel type, and the electrical device 5 is a wafer type.

Figure 21:
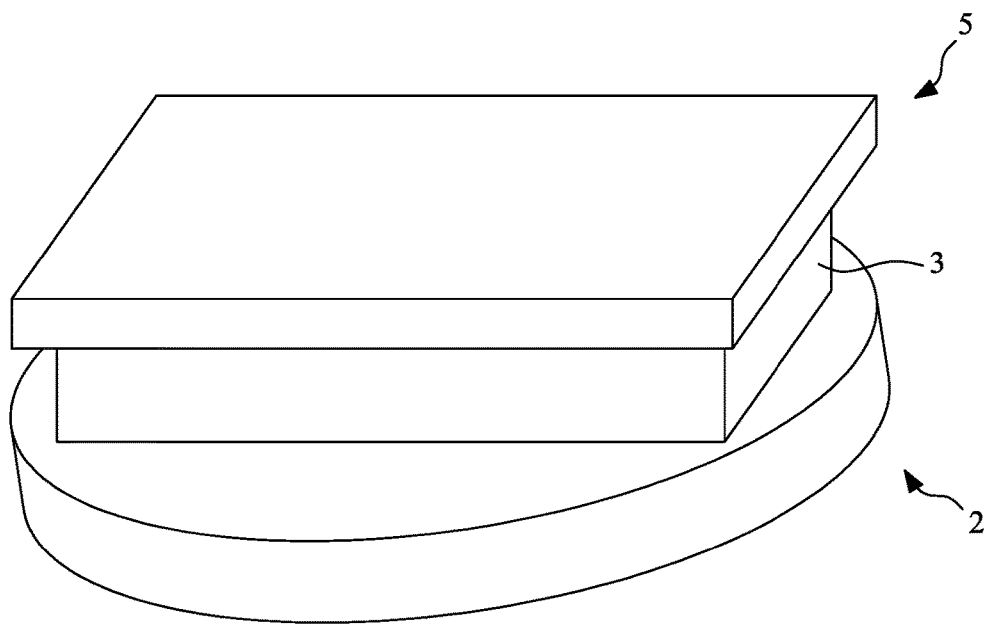

FIG. 21 illustrates a schematic perspective view of the substrate 2, the dielectric layer 3 and the electrical device 5 depicted in FIG. 18 according to some embodiments of the present disclosure. The substrate 2 is a wafer type, and the electrical device 5 is a panel type.

Figure 22:
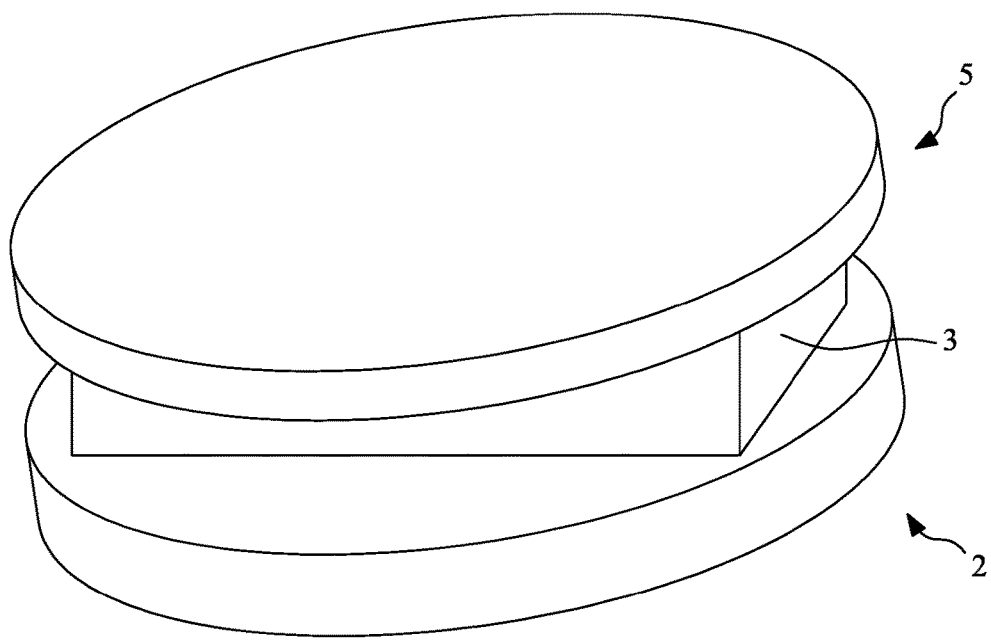

FIG. 22 illustrates a schematic perspective view of the substrate 2, the dielectric layer 3 and the electrical device 5 depicted in FIG. 18 according to some embodiments of the present disclosure. The substrate 2 and the electrical device 5 are both wafer types.

Figure 23:
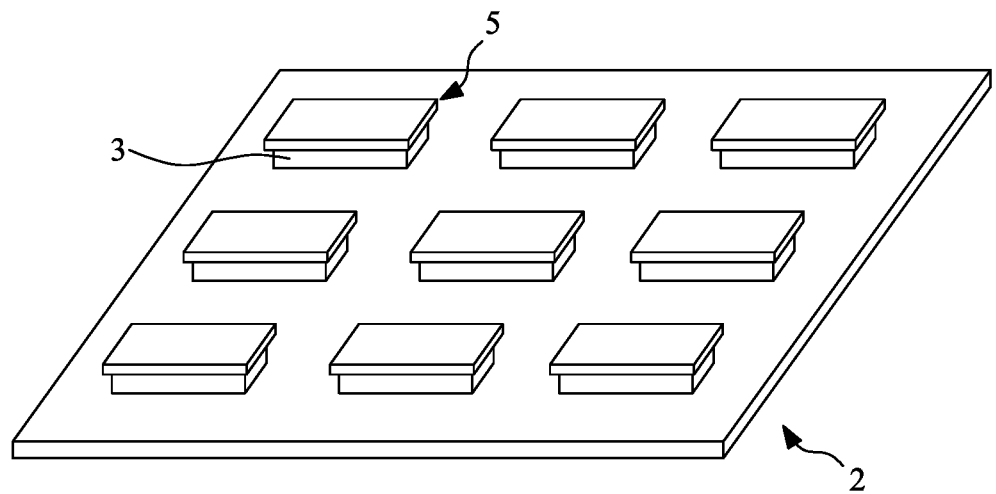

FIG. 23 illustrates a schematic perspective view of the substrate 2, the dielectric layer 3 and the electrical device 5 depicted in FIG. 18 according to some embodiments of the present disclosure. A plurality of electrical devices 5 of chip types are bonded to a substrate 2 of a panel type (e.g., rectangular or square).

Figure 24:
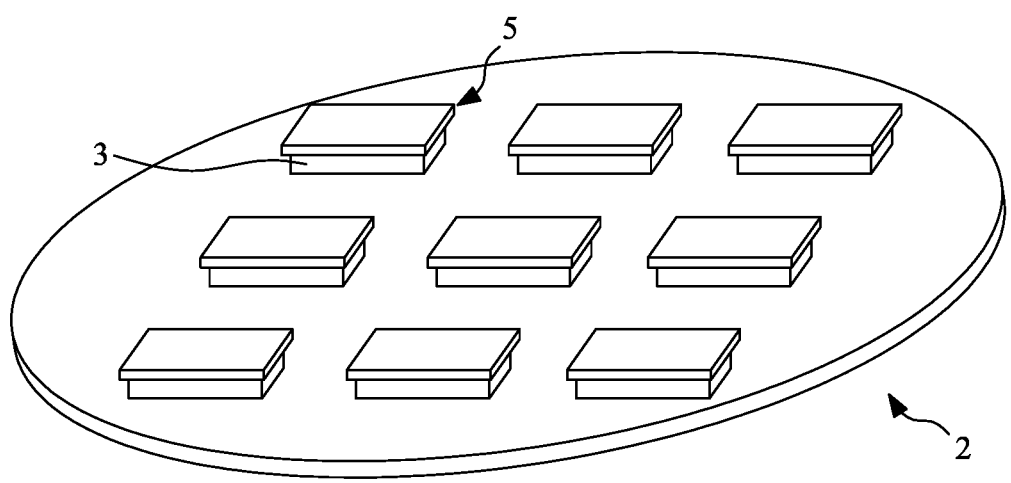

FIG. 24 illustrates a schematic perspective view of the substrate 2, the dielectric layer 3 and the electrical device 5 depicted in FIG. 18 according to some embodiments of the present disclosure. A plurality of electrical devices 5 of chip types are bonded to a substrate 2 of a wafer type (e.g., circular or elliptical).

Then, a singulation process is performed to cut the substrate 2, the dielectric layer 3 and the electrical device 5 so as to obtain the semiconductor package 1 of FIG. 1.

Figure 25:
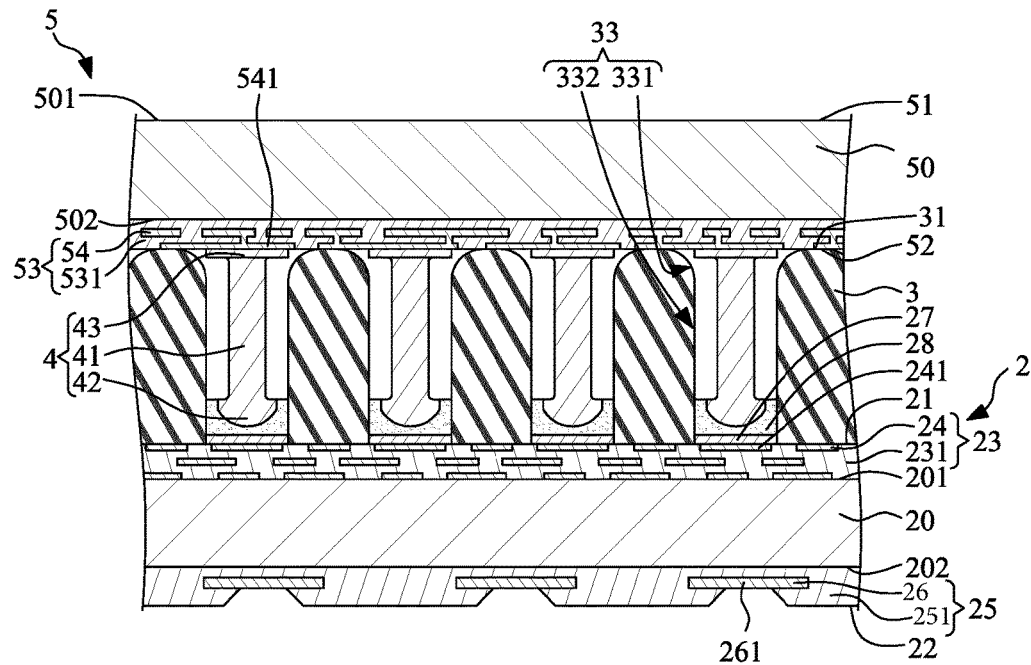
FIG. 25 and FIG. 26 illustrate a semiconductor manufacturing process according to some embodiments of the present disclosure.
Figure 26:
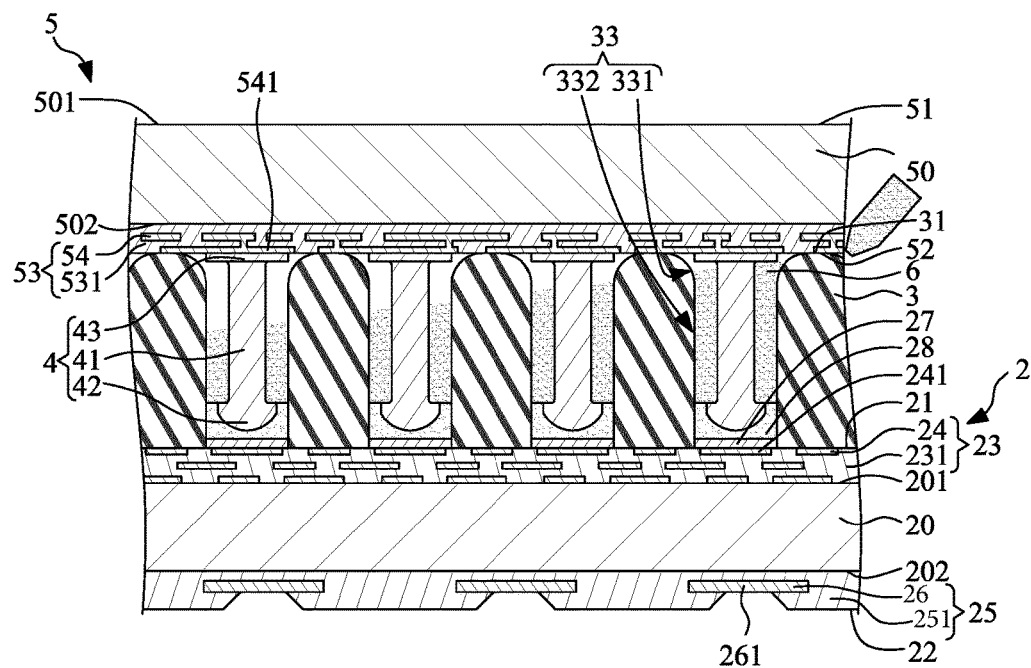

FIGS. 25-26 illustrate a semiconductor manufacturing process according to some embodiments of the present disclosure. The initial stages of the illustrated process are the same as the stages illustrated in FIGS. 9 to 10 and FIG. 12 to FIG. 15. FIG. 25 depicts a stage subsequent to that depicted in FIG. 15. Referring to FIG. 25, the electrical device 5 is pressed toward the substrate 2 with no or little isolation material 6 present, such that the conductive pillar 4 is inserted in the respective through hole 33. In at least one embodiment, the substrate 2 is selectively heated to a temperature such that the first bonding material 281 is in a molten state, and the electrical device 5 is not heated. That is, a reflow process is not performed, and warpage is reduced. Then, the second bonding material 282 on the cap portion 42 of the conductive pillar 4 contacts the first bonding material 281 on the intermediate layer 27 on the first pad 241. Then, the second bonding material 282 on the cap portion 42 is also be melted, and the second bonding material 282 and the first bonding material 281 are fused together to form the bonding layer 28 (FIG. 1). Thus, the cap portion 42 of the conductive pillar 4 is electrically connected to and bonded to the first pad 241.

Referring to FIG. 26, the isolation material 6 in a liquid state is applied to a gap between the sidewall of the through hole 33 and the conductive pillar 4. The material of the isolation material 6 may be, for example, an underfill, a non-conductive film (NCF) or a non-conductive paste (NCP). In at least one embodiment, the isolation material 6 fills the through hole 33 and covers the top surface 31 of the dielectric layer 3. Then, a singulation process is performed to cut the substrate 2, the dielectric layer 3 and the electrical device 5 so as to obtain the semiconductor package 1 of FIG. 1.

As should be noted, compared with some pillar or bump pads, the improved structure of embodiments of the present disclosure provides significantly higher lateral stress tolerance and more compact sizes of pillars and/or bump pads. According to embodiments of the present disclosure, a semiconductor package able to avoid or minimize warpage is advantageously provided.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" consistent can refer to a range of variation of less than or equal to ±10% of an average value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a substrate including at least one first pad;
   a dielectric layer disposed on the substrate and defining at least one through hole corresponding to the at least one first pad, the dielectric layer having a top surface and a bottom surface opposite to the top surface;
   at least one conductive pillar disposed in the at least one through hole, the at least one conductive pillar including a body portion and a cap portion, such that a gap is defined between a sidewall of the at least one through hole and the conductive pillar, and the cap portion is located between the top surface of the dielectric layer and the bottom surface of the dielectric layer; and
   an electrical device disposed on the dielectric layer and electrically connected to the body portion of the at least one conductive pillar;
   wherein the body portion is physically connected to the cap portion, the cap portion is electrically connected to the at least one first pad, the cap portion is located between the body portion and the first pad, and a maximum width of the cap portion is greater than a maximum width of the body portion.

2. The semiconductor package of claim 1, wherein the at least one through hole includes an upper portion and a main portion farther away from the top surface of the dielectric layer than the upper portion, and a maximum width of the upper portion is greater than a maximum width of the main portion.

3. The semiconductor package of claim 2, wherein the main portion has a substantially consistent width, and a width of the upper portion decreases with increasing distance from the top surface of the dielectric layer.

4. The semiconductor package of claim 2, wherein a sidewall of the upper portion of the at least one through hole is a slanted line or a curved line from a cross-sectional view.

5. The semiconductor package of claim 2, wherein the maximum width of the main portion is specified as S, and the maximum width of the cap portion of the at least one conductive pillar is in a range of about 0.65×S to about 0.75×S.

6. The semiconductor package of claim 2, wherein the maximum width of the main portion is specified as S, and the maximum width of the body portion of the at least one conductive pillar is in a range of about 0.5×S to about 0.65×S.

7. The semiconductor package of claim 2, wherein the maximum width of the upper portion is specified as B, the maximum width of the main portion is specified as S, a sidewall of the upper portion of the at least one through hole is a curved line with a curvature radius r from a cross-sectional view, and the curvature radius r satisfies the following equation:

$r \leq (B-S)\sqrt{2}/2$.

8. The semiconductor package of claim 1, wherein the body portion of the at least one conductive pillar and the cap portion of the at least one conductive pillar are formed integrally.

9. The semiconductor package of claim 1, further comprising an isolation material filling the gap between the sidewall of the at least one through hole and the at least one conductive pillar.

10. The semiconductor package of claim 1, wherein the at least one conductive pillar further includes a base portion electrically connected to the electrical device, and an end of the body portion of the at least one conductive pillar is physically connected to the base portion of the at least one conductive pillar.

11. The semiconductor package of claim 10, wherein a maximum width of the base portion of the at least one conductive pillar is substantially equal to a maximum width of a main portion of the at least one through hole.

12. The semiconductor package of claim 1, wherein the dielectric layer is a monolithic structure.

13. A semiconductor package, comprising:
    a substrate including at least one first pad;
    a dielectric layer disposed on the substrate and defining at least one through hole which exposes the at least one first pad, the dielectric layer having a top surface and a bottom surface opposite to the top surface;
    at least one conductive pillar disposed in the at least one through hole, the at least one conductive pillar including a body portion and a cap portion, such that a gap is defined between a sidewall of the at least one through hole and the conductive pillar, the body portion is closer to the top surface of the dielectric layer than the bottom surface of the dielectric layer, and the top surface of the dielectric layer is at a level higher than the cap portion; and
    an electrical device disposed on the dielectric layer and electrically connected to the body portion of the at least one conductive pillar;
    wherein the body portion is physically connected to the cap portion, the cap portion is electrically connected to the at least one first pad, the cap portion is located between the body portion and the first pad, a maximum width of the cap portion is greater than a maximum width of the body portion, and the at least one conductive pillar is bent towards the sidewall of the at least one through hole.

14. The semiconductor package of claim 13, wherein a sidewall of the at least one conductive pillar defines at least one curvature from a cross-sectional view.

15. The semiconductor package of claim 13, wherein the substrate has a length L, the at least one conductive pillar has a material strength Sp, and a warpage W of the substrate satisfies the following equation:

$W \leq (L/2)\tan\{\sin^{-1}[S_P/(K_1 \sigma)]\}$, wherein $K_1$ is a stress concentration factor at a corner between the body portion of the at least one conductive pillar and the cap portion of the at least one conductive pillar, and σ is a total thermal stress at the corner.

16. The semiconductor package of claim 13, further comprising an isolation material filling the gap between the sidewall of the at least one through hole and the at least one conductive pillar, wherein the substrate has a length L, the isolation material has a material strength $S_B$, and a warpage W of the substrate satisfies the following equation:

$W \leq (L/2)\tan\{\cos^{-1}[S_B \times (1-A/R)/\sigma]\}$, wherein A is a sum of areas of all conductive pillars, that is, A=(number of conductive pillars)×(area of each of the conductive pillars), R is total area of the electrical device, and σ is a total thermal stress at a corner between the body portion of the at least one conductive pillar and the cap portion of the at least one conductive pillar.

17. A semiconductor manufacturing process, comprising:
    (a) providing a substrate including at least one first pad;

(b) forming a dielectric layer on the substrate, the dielectric layer having a top surface and a bottom surface opposite to the top surface;
(c) forming at least one through hole in the dielectric layer which exposes the at least one first pad;
(d) providing an electrical device including at least one conductive pillar, the at least one conductive pillar including a body portion and a cap portion, wherein the body portion is physically connected to the cap portion, and a maximum width of the cap portion is greater than a maximum width of the body portion; and
(e) inserting the at least one conductive pillar in the at least one through hole, such that the cap portion of the at least one conductive pillar is electrically connected to the at least one first pad and the cap portion is located between the body portion and the first pad, a gap is defined between a sidewall of the at least one through hole and the conductive pillar, and the cap portion is located between the top surface and the bottom surface of the dielectric layer.

18. The semiconductor manufacturing process of claim 17, wherein in (b), the dielectric layer is a monolithic component.

19. The semiconductor manufacturing process of claim 17, wherein after (c), the semiconductor manufacturing process further comprises:
(c1) applying an isolation material in a liquid state to the at least one through hole.

20. The semiconductor manufacturing process of claim 17, wherein after (e), the semiconductor manufacturing process further comprises:
(f) applying an isolation material in a liquid state to the gap between the sidewall of the at least one through hole and the at least one conductive pillar.

21. The semiconductor manufacturing process of claim 17, wherein the electrical device is a semiconductor chip.

* * * * *